United States Patent
Kaviani (10) Patent No.: US 7,453,297 B1
(45) Date of Patent: Nov. 18, 2008

(54) METHOD OF AND CIRCUIT FOR DESKEWING CLOCK SIGNALS IN AN INTEGRATED CIRCUIT

(75) Inventor: Alireza S. Kaviani, San Jose, CA (US)

(73) Assignee: XILINX, Inc., San Jose, CA (US)

(*) Notice: Subject to any disclaimer, the term of this patent is extended or adjusted under 35 U.S.C. 154(b) by 224 days.

(21) Appl. No.: 11/197,809

(22) Filed: Aug. 5, 2005

(51) Int. Cl.
    *H03L 7/00* (2006.01)
(52) U.S. Cl. .................. 327/161; 327/149; 327/158
(58) Field of Classification Search ............. 327/141, 327/147, 149, 156, 158, 161–163
    See application file for complete search history.

(56) References Cited

U.S. PATENT DOCUMENTS

| | | | |
|---|---|---|---|
| 5,049,766 A * | 9/1991 | van Driest et al. ......... 327/269 |
| 5,087,829 A * | 2/1992 | Ishibashi et al. ........... 327/152 |
| 5,463,337 A * | 10/1995 | Leonowich ................ 327/158 |
| 5,594,376 A | 1/1997 | McBride et al. |
| 5,646,564 A | 7/1997 | Erickson et al. |
| 5,801,559 A * | 9/1998 | Sawai et al. ............... 327/116 |
| 6,011,732 A * | 1/2000 | Harrison et al. ........... 365/194 |
| 6,326,826 B1 * | 12/2001 | Lee et al. .................. 327/161 |
| 6,396,322 B1 * | 5/2002 | Kim et al. .................. 327/158 |
| 6,426,985 B1 * | 7/2002 | Iwata et al. ................ 375/371 |
| 6,441,659 B1 * | 8/2002 | Demone .................... 327/156 |
| 6,501,312 B1 * | 12/2002 | Nguyen ..................... 327/161 |
| 6,625,242 B1 | 9/2003 | Yoo et al. |
| 6,683,928 B2 * | 1/2004 | Bhullar et al. ............. 375/374 |
| 6,710,637 B1 | 3/2004 | Chan |
| 6,775,342 B1 | 8/2004 | Young et al. |
| 6,839,301 B2 * | 1/2005 | Lin et al. .................. 365/233.12 |
| 6,845,459 B2 * | 1/2005 | Lin ........................... 712/401 |
| 6,847,240 B1 | 1/2005 | Zhou |
| 6,847,241 B1 * | 1/2005 | Nguyen et al. ............. 327/158 |
| 7,009,407 B2 * | 3/2006 | Lin ........................... 324/601 |
| 7,009,433 B2 * | 3/2006 | Zhang et al. ............... 327/158 |
| 7,071,751 B1 | 7/2006 | Kaviani |
| 7,190,196 B1 | 3/2007 | Kaviani |
| 7,190,756 B1 | 3/2007 | Kaviani et al. |
| 7,250,798 B2 | 7/2007 | Deivasigamani et al. |
| 7,259,601 B2 | 8/2007 | Zarate et al. |

OTHER PUBLICATIONS

Xilinx, In.; U.S. Appl. No. 11/015,674 by Kaviani filed Dec. 17, 2004.
Xilinx, Inc.; U.S. Appl. No. 11/198,575 by Kaviani filed Aug. 5, 2005.
U.S. Appl. No. 11/015,674, Kaviani filed Dec. 17, 2004, entitled Method of and Circuit for Deskewing clock Signals in an Integrated Circuit, Xilinx, Inc, 2100 Logic Drive, San Jose, CA 95124.

* cited by examiner

*Primary Examiner*—Lincoln Donovan
*Assistant Examiner*—Hai L. Nguyen
(74) *Attorney, Agent, or Firm*—John J. King (57) ABSTRACT

The methods and circuits of the various embodiments of the present invention relate to deskewing a generated clock signal. According to one embodiment, a method of deskewing a clock signal in a circuit having a delay line comprises steps of measuring an intrinsic delay in a delay line; aligning the frequency of a generated clock signal with the frequency of a reference clock signal; and aligning the phase of the generated clock signal and the reference clock signal using the measured intrinsic delay. According to another embodiment, a circuit for deskewing a clock signal in a circuit having a delay line is also described.

17 Claims, 6 Drawing Sheets

METHOD OF AND CIRCUIT FOR DESKEWING CLOCK SIGNALS IN AN INTEGRATED CIRCUIT

FIELD OF THE INVENTION

The present invention relates generally to clock signals, and in particular, to a method of and circuit for deskewing and/or phase shifting a clock signal in an integrated circuit.

BACKGROUND OF THE INVENTION

Clock signals are used for a variety of purposes in digital circuits, both on board level systems and integrated circuit (IC) devices. An integrated circuit such as a programmable logic device (PLD) typically receives one or more external reference clock signals to generate one or more internal clock signals to operate internal digital circuits. In synchronous systems, global clock signals are used to synchronize various circuits across the board or IC device. For example, internal circuits could be clocked by a first clock signal at a first clock frequency, while input/output (I/O) circuits could be clocked by a second clock signal at a second clock frequency. As the complexity of digital systems increases, clocking schemes continue to become more complicated, and there is a greater need for additional clock signals and more flexibility in generating various clock signals.

While multiple clock generating circuits could be used to generate the multiple clock signals, clock generating circuits typically consume a large amount of chip space. Therefore, most systems receive an external clock signal or use one clock generating circuit to generate a first clock signal called a reference clock signal, and derive other clock signals from the reference clock signal using specialized circuits. However, these internal clock signals must be carefully controlled to ensure proper timing in the integrated circuit. It is important for proper operation of the integrated circuit device that a generated clock signal be maintained accurately at the specified phase and frequency. This is often done by assuring that the generated clock signal is phase aligned and frequency aligned with the reference clock signal. Clock management circuits are used in integrated circuits to perform such functions as deskewing and phase shifting.

Figure 1:
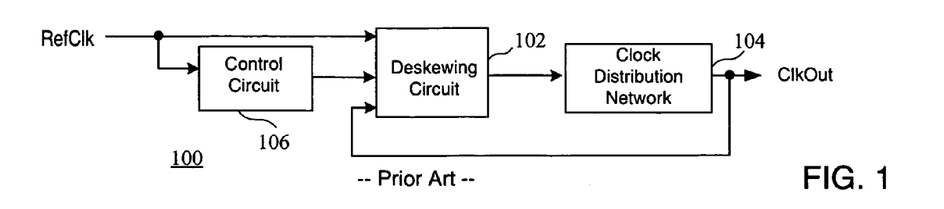
FIG. 1 is a block diagram of a conventional deskewing circuit.

Delay-locked loops (DLLS) such as, for example, DLLs in the Virtex or Spartan Field Programmable Gate Array (FPGA) product series from Xilinx Inc. of San Jose, Calif., are one type of clock management system used to manage the propagation delay of the clock signals by using a delay line, and therefore are used for deskewing and phase shifting. As shown in FIG. 1, a deskewing circuit 102 which could comprise a delay lock loop, for example, is coupled to receive an input clock signal (clkin) and the output clock signal (clkout) from the output of the clock distribution network 106. A control circuit 106 will control the value of the delay line so that the output clock signal is in phase with the input clock signal. If the delay line in the circuit is voltage-controlled, analog circuits adjust the phase by adjusting the voltage applied to the delay line (i.e. voltage controlled delay elements). In a clocking architecture based on a tap-controlled delay (TCD) line, the number of delay elements in a delay line is selected to control the delay, where the number of the delay elements in the TCD is dictated by the lowest frequency range. However, a conventional tap-controlled delay line may be sensitive to environmental and operating conditions such as process variations, voltage, temperature, and noise. Tap-controlled delay lines can also occupy a large amount of area, and may introduce duty cycle distortion.

Delay-locked loop circuits often have a number of delay lines. A control block of a delay-locked loop circuit finds the correct amount of shifting required by all the delay lines of a portion of the circuit, commonly called the custom block, which includes the delay lines that control the phase of the clocks. Finding the delay select vectors is also known as the locking process. However, controlling delay lines in conventional devices often requires adjusting clocks in different clock domains for the locking process. Further, the control circuit of a conventional delay-locked loop must often run at a higher frequency than would otherwise be required because the delay lines are operating at the same frequency as the control block.

Conventional circuits also often require a user to set a frequency mode, such as a high frequency or low frequency mode, to lock to the reference frequency. Delay-locked loops often have low and high frequency operating modes. These operating modes, which define both input and output frequency restrictions, must be selected by a user. In order for the delay-locked loop to generate an output signal, the delay-locked loop must lock on the reference signal. However, if the reference signal is not within the range of input signals selected by the user, the delay-locked loop will not lock on reference signal and will not generate the desired output clock signal.

Finally, when aligning the phase of a generated clock to the phase of a reference clock, it is important that any changes to a delay select value of a digital delay line for adjusting the phase of a clock signal does not shift the phase of the generated signal beyond a maximum desirable shift. Because there is typically a recovery time for the delay-locked loop when a clock signal is compensated for delay, it is necessary to insure that the total phase shift introduced by a delay line used for phase alignment does not exceed a certain amount. Phase shifting in a delay lock loop that may exceed a maximum amount of shifting could result in loss of lock for the delay-locked loop.

Accordingly, there is a need for a method of and circuit for effectively deskewing clock signals in an integrated circuit.

SUMMARY OF THE INVENTION

The methods and circuits of the various embodiments of the present invention relate to deskewing and/or phase shifting a generated clock signal. According to one embodiment, a method of deskewing a clock signal in a circuit having a delay line comprises steps of measuring an intrinsic delay in a delay line; aligning the frequency of a generated clock signal with the frequency of a reference clock signal; and aligning the phase of the generated clock signal and the reference clock signal using the measured intrinsic delay.

According to another embodiment, a circuit for deskewing a clock signal in a circuit having a digital delay line comprises a phase synchronization circuit having a first delay line coupled to receive a reference clock signal and a phase delay value. A frequency synchronization circuit is coupled to the phase synchronization circuit and comprises a second delay line and a third delay line coupled in series and receiving a frequency delay value. Finally, a control circuit is coupled to select one of the outputs of said first delay line, said second delay line or said third delay line to generate an output clock signal.

DETAILED DESCRIPTION OF THE DRAWINGS

Figure 2:
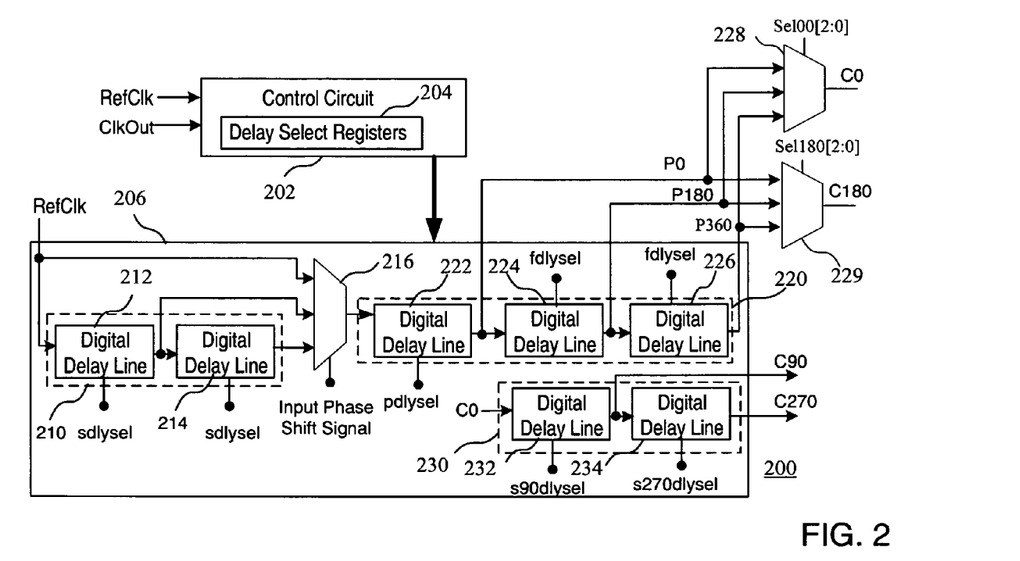
FIG. 2 is a block diagram of a deskewing and phase shifting circuit according to an embodiment the present invention.

Turning first to FIG. 2, a block diagram of a circuit 200 for deskewing and phase shifting a generated clock signal according to an embodiment the present invention is shown. In particular, a control circuit 202 is coupled to receive a reference clock signal RefClk and an output clock signal C0, and generate delay select values for the various delay lines. The delay select values are stored in a delay select register 204, which is coupled to a clock generator circuit 206. The control circuit 202 periodically updates the delay select values and provides a number of functions for more effectively locking to the reference clock signal, as will be described in more detail below. For example, the control circuit runs at a single frequency which is independent of the clock generator circuit, and provides synchronization of the digital delay lines to avoid delay select set up and hold times. The control circuit also provides an automatic frequency search which eliminates the requirement for a user to select a low frequency or high frequency mode, and provides an improved locking time. Finally, the circuit provides for rotational deskewing to avoid excessive shifting when deskewing and provides glitch-free deskewing. These and other functions of the control circuit will be described in detail in reference to the block diagram of the main functions of the control circuit of FIG. 3.

The clock generator circuit 206 comprises a plurality of digital delay lines which are coupled to generate signals typically required in an integrated circuit. In particular, a reference clock is coupled to an input circuit 210 for initially shifting the reference clock signal before it is deskewed and/or phase shifted. The input circuit 210 comprises a first digital delay line 212 coupled in series with a second digital delay line 214. Each of the digital delay lines of the input circuit 210 is coupled to receive a shift delay vector (sdlysel). The shift delay vector could be selected so that the first and second digital delay lines shift the reference clock signal by 180 degrees and 360 degrees, respectively, for example. Alternatively, the values could be separately selected to generate different values, where a desired relative phase shift is defined as:

$$\text{shift}=(S-I)*PS\_MAG/256,\qquad(1)$$

where PS_MAG represents a value between −255 and +255 for a shift amount between −180 and 180 and where S represents the shift delay value and I represents and intrinsic delay. A multiplexer 216 is coupled to receive the output of the digital delay line 212 at a first input, the output of the digital delay line 214 at a second input, and the input signal at a third input. The multiplexer is controlled by an input phase shift signal for selecting one of the shifted reference clocks or the RefClk input.

The output of the multiplexer 216 is coupled to a deskewing circuit 220 comprising a phase shifting digital delay line 222 which is coupled to receive a phase shifting delay select vector (pdlysel). As will be described in more detail below, the output of the phase shifting digital delay line 222 may be selected as the phase aligned output C0, which is used by other circuits to generate clock signals at various phases. The deskewing circuit 220 also includes a pair of frequency shifting digital delay lines comprising a first digital delay line 224 and a second digital delay line 226, each of which receives a frequency delay select vector (fdlysel). The output of the first digital delay line comprises a P180 signal which is a 180 degree phase shifted signal of P0, and is coupled to the input of the second digital delay line 226. The output of the second digital delay line is a 360 degree shifted signal P360. The P0, P180 and P360 signals are coupled to a pair of multiplexers 228 and 229 which generate an output clock signal C0 and a 180 degree phase shifted output clock signal C180. The selection of the appropriate signal P0, P180 or P360 to generate C0 and C180 will be described in more detail in reference to FIGS. 14-18. The selection of the phase delay select vector coupled to the digital delay line 222 and the frequency delay select vector coupled to the digital delay lines 224 and 226 will be described in more detail in reference to FIG. 7.

A phase shifting circuit 230 comprising a pair of digital delay lines is also provided for generating phase shifted output clock signals. In particular, a digital delay line 232 is coupled to receive C0 and generates a phase shifted output C90 in response to a shift 90 delay select vector (S90dlysel). The output of the digital delay line 232 is coupled to the input of a second phase shifting digital delay line 234 which generates a 270 degrees phase shifted clock signal C270 in response to a shift 270 delay select value (S270dlysel). Accordingly, a full range of output clock signals can be generated using digital delay lines which are also used for phase and frequency alignment. Although 90 degree and 270 degree phase shifts are shown, the circuit of FIG. 2 enables relative phase shifting by allowing the selection of delay select vectors coupled to digital delay lines 232 and 234 for generating any relative phase signal. However, according to one aspect of FIG. 2, the requirement that pairs of digital delay lines be used together enable a significant reduction in the circuits required to implement the digital delay lines, as will be described in more detail in reference to FIGS. 8-10.

Figure 3:
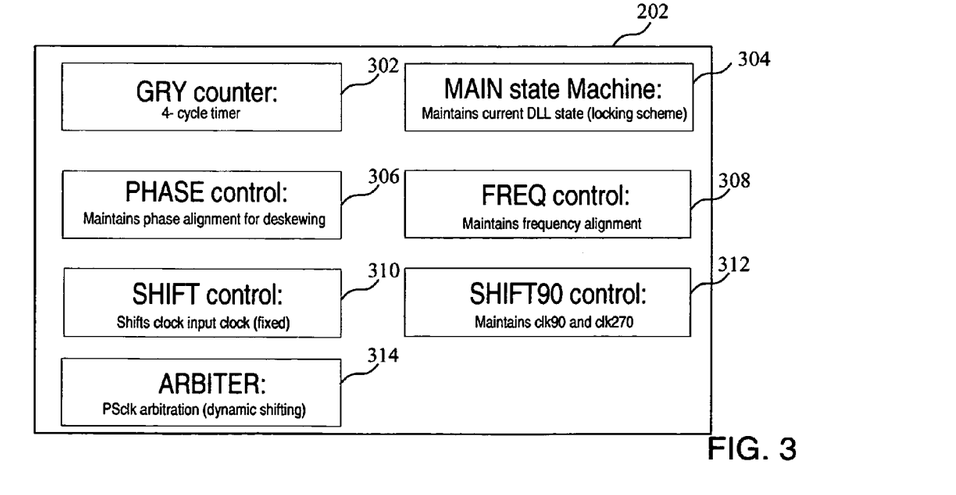
FIG. 3 is a functional block diagram showing functional blocks of a control circuit for enabling deskewing and phase shifting according to an embodiment the present invention.

Turning now to FIG. 3, a functional block diagram shows functional blocks of the control circuit 202 for enabling deskewing and phase shifting according to an embodiment the present invention. An example of an implementation of FIGS. 2 and 3 may be found in the Spartan 3E FPGA from Xilinx, Inc. Each of these functions will be described in more detail in reference to later block diagrams and/or timing waveforms. The primary function of the control circuit 202 is determining the correct amount of shifting required by all the delay lines, controlled by a delay select input vector. The determination of the correct delay select input vector is also known as locking process. A secondary function of the control circuit 202 is to maintain the correct shifting after lock despite environmental changes. As shown in FIG. 3, the primary functional blocks include a gray counter 302 which controls the timing of the locking scheme, as will be described in reference to FIG. 13. A main state machine 304 maintains the current states. The circuit also comprises a phase control function 306 for maintaining phase alignment for deskewing, and a frequency control function 308 for maintaining frequency alignment. The control circuit also comprises a shift control function 310 for providing shifted input clocks, as described generally above in reference to the input circuit 210 of FIG. 2, and a shift 90 control function 312 for maintaining clocks which are phase shifted by 90 degrees and 270 degrees. Finally, an arbiter 314 provides dynamic shifting of both input and output signals, as will be described in detail below.

Figure 4:
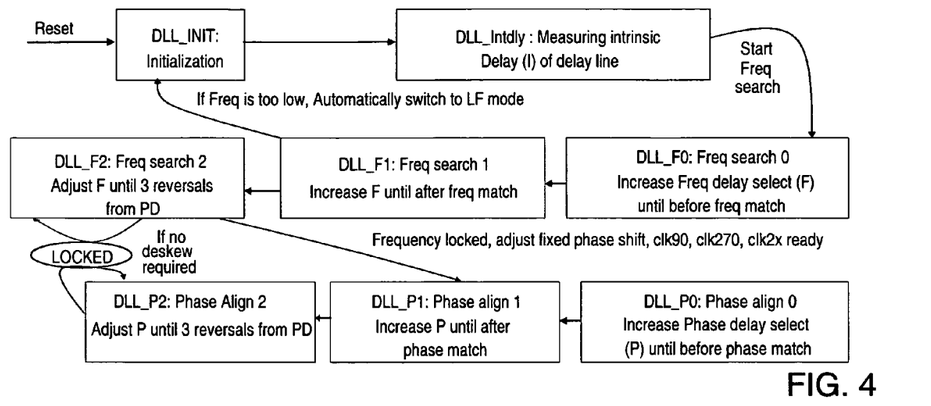
FIG. 4 is a flow diagram showing the operation of a circuit for deskewing and phase shifting according to an embodiment the present invention.
Figure 5:
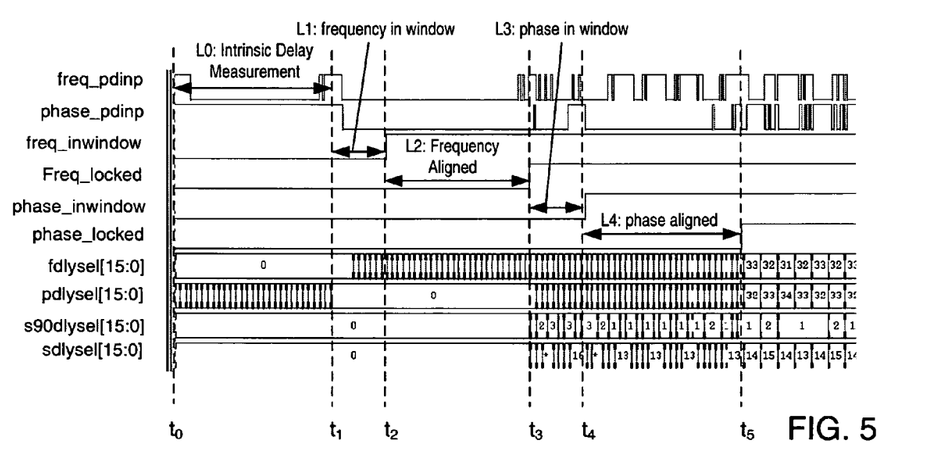
FIG. 5 is a timing diagram showing a locking scheme according to an embodiment the present invention.
Figure 6:
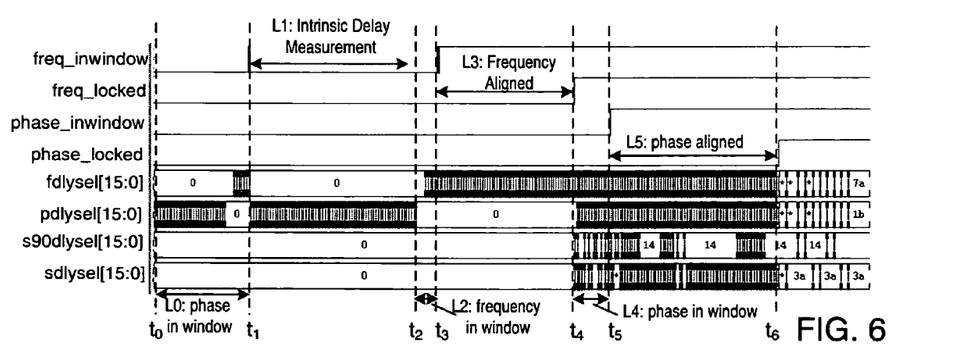
FIG. 6 is a timing diagram showing a locking scheme according to an embodiment the present invention having automatic frequency search.

Turning now to FIG. 4, a flow diagram shows the locking operation of the circuit 200 according to an embodiment the present invention. The shift 90 control function further enables a user to select any value of a phase shift of the input clock before going into phase alignment mode. The locking operation will also be described in reference to the timing waveforms of FIGS. 5 and 6, where the timing waveform of FIG. 5 shows how the circuit 200 locks in a high frequency mode, while the timing waveform of FIG. 6 shows how the circuit 200 automatically shifts from a high frequency mode to a low frequency mode in order to lock. After a DLL initialization period, an intrinsic delay of a digital delay line is measured, as will be described in more detail in reference to FIG. 7. An initial frequency search DLL_F0 is performed where the frequency delay select value (F) is increased until before a frequency match. The control circuit performs another frequency search DLL_F1 until another frequency match is determined. Finally, a third frequency search DLL_F2 is performed where the frequency delay select value is adjusted until three reversals of the phase detector occur, indicating that the correct frequency had been reached, as is well known in the art. The three stages of adjusting the frequency delay select value (F) could be used to determine the various bits of a delay select value, as will be described in more detail in reference to FIG. 9 below. If no deskew is required, the circuit maintains a lock on the frequency.

One beneficial function of the control circuit is that a unified locking scheme provides a single frequency range for a user of the circuit. That is, if the frequency is determined to be too low, the circuit automatically shifts to a low frequency (LF) mode, and returns to the initialization step. If the frequency is locked, the phase is then adjusted to achieve phase alignment. In an initial phase alignment step DLL_P0, the phase align signal P is increased until before a phase match is detected. The phase alignment process then follows two more adjustments of the phase delay select value P until three reversals of the phase detector occur at a stage Phase Align 2.

As can be seen in the timing waveform of FIG. 5, an intrinsic delay measurement of a delay line is performed between a time $t_0$ and $t_1$. After a "frequency in window" period (i.e. a period when the frequency is determined to be close enough to the desired frequency that the phase detector will converge on the correct frequency) shown between time $t_1$ and $t_2$, the frequency is aligned between time $t_2$ and $t_3$. As can be seen, the frequency, designated by a 16 bit value fdlysel[15:0], is locked at time $t_3$. After a "phase in window" period between time $t_3$ and $t_4$, the phase is aligned between time $t_4$ and $t_5$, and the phase, designated by a 16 bit value polysel[15:0], is locked at a time $t_5$. After the phase is aligned, the shift and 90 degree shift delay register values, designated by sdlysel[15:0] and s90dlysel[15:0] respectively, are determined. The determination of the shift value (S) and 90 degree shift value (S90) will be described in more detail below.

As can be seen in the timing waveform of FIG. 6, an initial "phase in window" period between a time $t_0$ and $t_1$ is required if the initial frequency alignment steps (such as steps DLL_F0 and DLL_F1 of FIG. 4) does not yield a match in the high frequency mode, indicating that the frequency is too low, in which case the circuit automatically switches to a low frequency mode. Although the circuit may generally take longer to lock when the reference frequency is a low frequency signal, the user is not required to select whether the frequency search should be performed in a low frequency or high frequency mode. As can be seen, an intrinsic delay measurement is made between times $t_1$ and $t_2$. After a frequency in window between times $t_2$ and $t_3$, the frequency is aligned between times $t_3$ and $t_4$, at which time the frequency is locked. Finally, after a phase in window between times $t_4$ and $t_5$, the phase is aligned between times $t_5$ and $t_6$, and the phase is locked at a time $t_6$.

Figure 7:
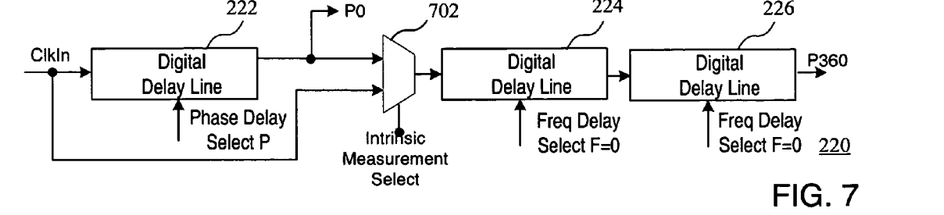
FIG. 7 is a block diagram of a circuit for determining an inherent delay in a delay line according to an embodiment the present invention.

Turning now to FIG. 7, a block diagram of a circuit for determining an intrinsic or inherent delay in a delay line according to an embodiment the present invention is shown. The determination of other delay values will also then be described based upon the determination of the intrinsic delay of the delay line. Using the series of three delay lines 222-226 of the deskewing circuit 220 and a multiplexer 702 to couple the input clock to the digital delay line 224, the intrinsic delay of the delay line 222 can be determined. When the intrinsic measurement select signal input to multiplexer 702 is selected to determine the intrinsic delay of the digital delay line, the intrinsic delay is determined by setting the frequency delay select values F equal to zero, and then comparing the output of the digital delay line 222 and the output of the digital delay line 226. As can be seen by the following equations, the intrinsic delay I will equal the phase delay P when the frequency delay select values are set equal to zero.

$$P+I=2I+0 \quad (2)$$

$$P=I \quad (3)$$

Accordingly, the intrinsic delay I can be determined by adjusting the value of P until the output of the digital delay line 222 is aligned to the output of the digital delay line 226 when the input clock is coupled to the digital delay line 224. For example, the value of P could be determined when a phase detector detecting a phase difference between the outputs of the digital delay line 222 and the digital delay line 226 has three reversals. It is also possible to determine the correct value of the frequency delay select vector F using the circuit of FIG. 7. Because each delay line should generate a 180 degree phase shift, for a total of a 360 degree phase shift, the frequency delay select vector F is adjusted so that the output of the digital delay line 226 is in phase with the input clock signal Clkin (when the input clock signal is coupled to the digital delay line 224).

After determining the intrinsic delay of a delay line and the correct frequency delay select value F, it is also possible to determine the correct frequency delay select vectors for phase shifting. For example, to determine the delay select vector S90 for phase shifting by 90 degrees after frequency lock, the delay can be determined by considering the following equations:

$$4(S90+1)=T \quad (4)$$

$$T=2F+2I \quad (5)$$

$$S90+I=T/4=(F+I)/2 \quad (6)$$

$$S90=(F-I)/2$$

That is, the value of S90 can be calculated in terms of F and I, both of which are calculated as set forth above. The delay select vector for S270 is the same as the frequency delay select vector F. Relative phase shifting is then also possible for the shift 90 and the shift 270 clock signals, where a desired phase shift is set as some other value, so that the phase shifted values are set for a predetermined value which could be any pre-selected offset between 0 and 180 degrees from the clock C0 by selecting some other value of F.

Figure 8:
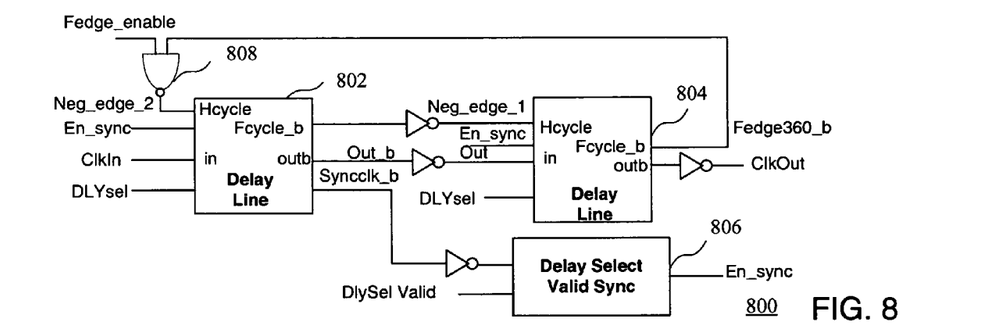
FIG. 8 is a block diagram of a digital delay line pair according to an embodiment the present invention.

Turning now to FIG. 8, a block diagram of a digital delay line pair according to an embodiment the present invention is shown. The digital delay line pair comprises a first delay line 802 coupled to a second delay line 804, and a delay select valid sync block 806 which generates an enable sync signal. Each delay line receives an appropriate delay select vector, which will depend upon the use of the digital delay line pair. For example, one pair of digital delay lines could be used for the frequency alignment, while another pair of digital delay lines could be used for phase shifting. Accordingly, the discussion of the digital delay line pair will be described generally, although it should be understood that there are various applications for digital delay line pairs described in this application. Each delay line receives an enable synchronization signal (En_sync) which is generated by the delay select valid sync circuit 806. The enable synchronization signal enables the control circuit to run at a single frequency which is independent of the clock generator circuit, and provides synchronization of the digital delay lines to avoid delay select set up and hold times.

A Clkin signal is received at the input of the delay line 802 which generates a delayed output signal at an output terminal (out_b), an inverted version of out_b which is also coupled to the input of the second delay line 804. Similarly, the second delay line generates a delayed output signal ClkOut at an output, which is also the output of the digital delay line pair. According to one unique aspect of the circuit of FIG. 8, the falling edge of an output signal is generated, for each delay line, by the other delay line. As will be described in more detail in reference to FIG. 10, the output signals are generated based upon a composite of a delayed rising edge and a delayed falling edge. That is, because the delay lines are often employed in pairs, the amount of circuitry needed to implement of delay line can be reduced by using only a single edge detector for each delay line. Accordingly, an edge detector of the delay line 802 will detect one clock edge, the rising clock edge in this example to generate the rising edge of the signal, while the falling edge of that signal is generated based upon a signal detected by an edge detector of the second delay line 804. The edge detectors operate in half cycles, depending upon an output of a NAND gate 808, as will be described in detail in reference to the timing waveform of FIG. 9. Generally, the NAND gate 808 will generate a Neg_edge_2 clock signal in a second half clock cycle. A Neg_edge_1 clock signal, which is based upon the Neg_edge_2 clock signal, is phase shifted (by 180 degrees in this case). Similarly, an edge detector of the delay line 804 will detect a rising edge of a signal input to the delay line 804 to generate the rising edge of the signal, while the falling edge of the signal will be generated using the delay line 802.

Figure 9:
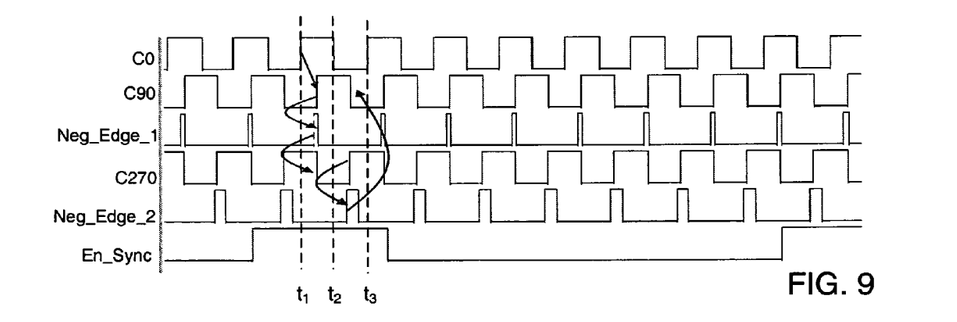
FIG. 9 is a timing diagram showing the use of falling edges of clock signals of the digital delay line pair of FIG. 8 according to an embodiment the present invention.

In particular, referring to the timing waveform of FIG. 9, an input clock C0 is input to the first delay line. According to the example of FIG. 9, an output clock signal C90 (i.e. a 90 degree phase shifted signal) is generated at the output of the first delay line 802 and an output clock signal C270 (i.e. a 270 degree phase shifted signal) is generated at the output of the second delay line 804. In a first half clock cycle between a time $t_1$ and $t_2$, the rising edge of the C90 clock signal is generated. During the first half of the clock cycle, the first delay line is not in falling edge mode, and Neg_edge_2 is low. A rising edge of a 90 degree phase shifted signal (which is generated based upon a rising edge of a C0 signal) generates an active Neg_edge_1 pulse, which is in turn used to generate the falling edge of the C270 signal.

The NAND gate 808 receives a falling edge enable signal (Fedge_enable) during the second half of the clock cycle between time $t_2$ and $t_3$, and the rising edge of the C270 signal is used to generate the falling edge of the C90 signal. That is, the rising edge of the C270 signal (designated as Fedge360b output by the second delay line) generates a Neg_edge_2 pulse, which puts the first delay line in an falling edge mode and therefore generates the falling edge of the C90 signal. Accordingly, as can be seen in FIG. 9, which shows how the delay lines are used to generate 90 degree and 270 degree phase shifted clock signals, the first delay line 802 generates a 90 degree delayed signal (C90) of the input clock signal (C0). The Neg_edge_1 signal (based upon the rising edge of the C90 signal, is also used to generate the falling edge of the C270 signal. Similarly, the falling edge of the C270 signal is used to generate the Neg_egde_2 signal which in turn is used to generate the falling edge of the C90 signal. Although references are made in the description of FIGS. 8 and 9 to rising and falling edges, the circuit could be reconfigured to generate falling and rising edges, respectively. That is, the circuit of FIG. 8 provides a first delay line which generates an edge transition, and a second delay line which generates the opposite transition of the signal.

As will be described below in reference to FIG. 10, the output signal of the first delay line is a merged signal based upon the rising edge of the input signal (detected by an edge detector of the first delay line) and the rising edge of the signal generated by the second digital delay line which is 180 degree phase shifted (and therefore corresponds to the falling edge of the output of the first delay line). Similarly, the rising edge of the output signal of the second delay line will be based upon the rising edge of the input signal detected by an edge detector of the second delay line, and the falling edge of the output signal generated by the second delay line will be based upon a rising edge of the signal coupled to the first digital delay line (which is also 180 degree phase shifted from the input to of the second delay line). The circuitry enabling the use of a falling edge of one delay line by the other delay line of the pair, and the benefits of such an arrangement will be described in more detail in reference to FIGS. 10-11. One benefit of the circuit of FIG. 8 is that it is further possible to control the duty cycle of the output regardless of that of the input internally. For example, if the second delay select vector is F, the duty cycle of output will be 50-50. Finally, also shown in FIG. 8 is a delay select valid circuit 808. As will be described in more detail in reference to FIG. 12 below, the use of a single enable signal to synchronize the enables for a plurality of delay lines allows the synthesizer control circuit to operate at a lower frequency than might otherwise be required and independent of the delay lines.

Figure 10:
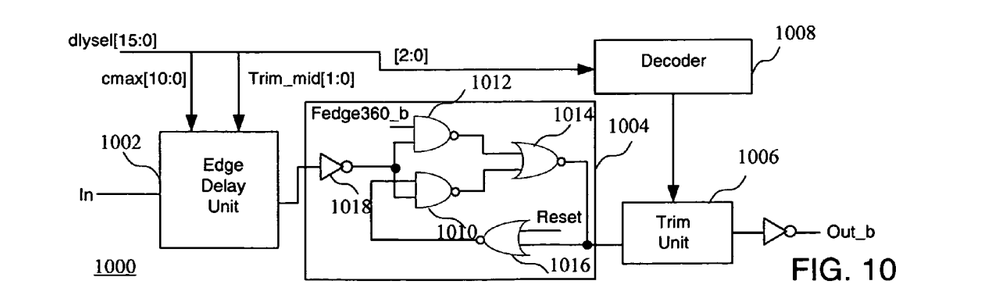
FIG. 10 is a block diagram of a delay line of the digital delay line pair of FIG. 8 according to an embodiment the present invention.

Turning now to FIG. 10, a block diagram of a digital delay line of FIG. 8 according to an embodiment the present invention is shown. While a counter controlled delay line, such as the counter controlled delay line described in U.S. application Ser. No. 11/015,674, filed on Dec. 17, 2004 by the Assignee of the present application, the entire application of which is incorporated herein by reference, would typically contain 2 edge delay units (one for a rising edge and one for a falling edge), the circuit of FIG. 10 comprises only a single edge unit for detecting a rising edge in order to reduce the circuitry required to implement the delay line. The elimination of an edge delay unit can result in an area saving of approximately a factor of 2. Accordingly, the circuits of FIGS. 8 and 10 provide an architecture for enabling phase shifting and deskewing using modified Counter-Controlled Delay lines (CCD), which are already an order of magnitude smaller than conventional tap controlled delay lines.

FIG. 10 shows a functional block diagram of a counter-controlled delay line 1000 in accordance with an embodiment of the present invention. Counter-controlled delay line 1000 receives an input clock Clkin, delays Clkin by an amount specified by a delay select vector (dlysel), and provides a delayed output clock Out_b. Counter-controlled delay line 1000 includes a single edge delay unit 1002, a merger circuit 1004, and a trim unit 1006, and may have an internal or external decoder 1008. As shown in the example of FIG. 10, the delay select vector is a 16 bit signal dlysel[15:0] that is divided into three groups corresponding to three granularities for adjusting and applying delay to the input signal. Bits [15:5] of the delay signal are used for a coarse grain delay adjustment and are provided to edge delay unit 1002 as a maximum count signal cmax[15:5]. Bits [4:3] of the delay select vector are used for a medium or mid grain delay adjustment and are provided to edge delay unit 1002 as a mid trim signal trim_mid[1:0]. Bits [2:0] of the delay select vector are used for a fine grain delay adjustment and are provided to decoder 1008 for controlling trim unit 1006. While the total number of delay select bits and the number of bits at each granularity shown in FIG. 10 may be preferable in some embodiments of the invention, other embodiments may have a different number of delay select bits organized differently in the three granularities.

As will be described below in greater detail, the edge delay unit 1002 delays the rising edges of its input signal and provides output edge pulses having rising edges delayed from the rising edges of Clkin by an amount specified by the cmax and Trim_Mid signals. Input clock Clkin is provided to edge delay unit 1002 to delay the rising edges of Clkin. Edge pulses corresponding to delayed rising and falling edges are provided from the edge delay unit 1002 and from another delay line to merger circuit 1004 for combining into a single merged delayed clock signal having delayed rising and falling edges. In the embodiment of FIG. 8, the falling edge clock signal corresponds to the Fedge360_b output by the second delay line 804. In particular, merger circuit 1004 receives a rising edge pulse signal, corresponding to a delayed rising edge of input clock CLKIN, and a falling edge pulse signal, corresponding to Fedge360_b output by the second delay line 804, and provides a merged output clock signal. Merger circuit 1004 may also receive a reset signal for resetting the circuit to a known state. Merger circuit 1004 includes AND gates 1010 and 1012, NOR gates 1014 and 1016, and an inverter 1018 coupled to generate the merged delay clock signal. The merged delayed clock signal is then provided by merger circuit 1004 to trim unit 1006 which provides a fine grain delay adjustment to the combined clock signal based on the decoded delay select bits and outputs the output signal Out_b.

The circuits of FIGS. 8 and 10 also provide an area-efficient circuit for deskewing and shifting clock signals in an integrated circuit. Deskewing and phase shifting functionality can require as many as eight delay lines, taking a significant amount of silicon area. The reduction of an edge detector of the digital delay lines provides a number of advantages over conventional circuits. For example, in addition to the improved area-efficiency described above, the circuit has a factor of 10-20 higher frequency range for shifting (towards the low end), a lower power requirement for the same functionality, and high tolerance to duty cycle distortion and mismatch of delay elements.

Figures 11, 12:
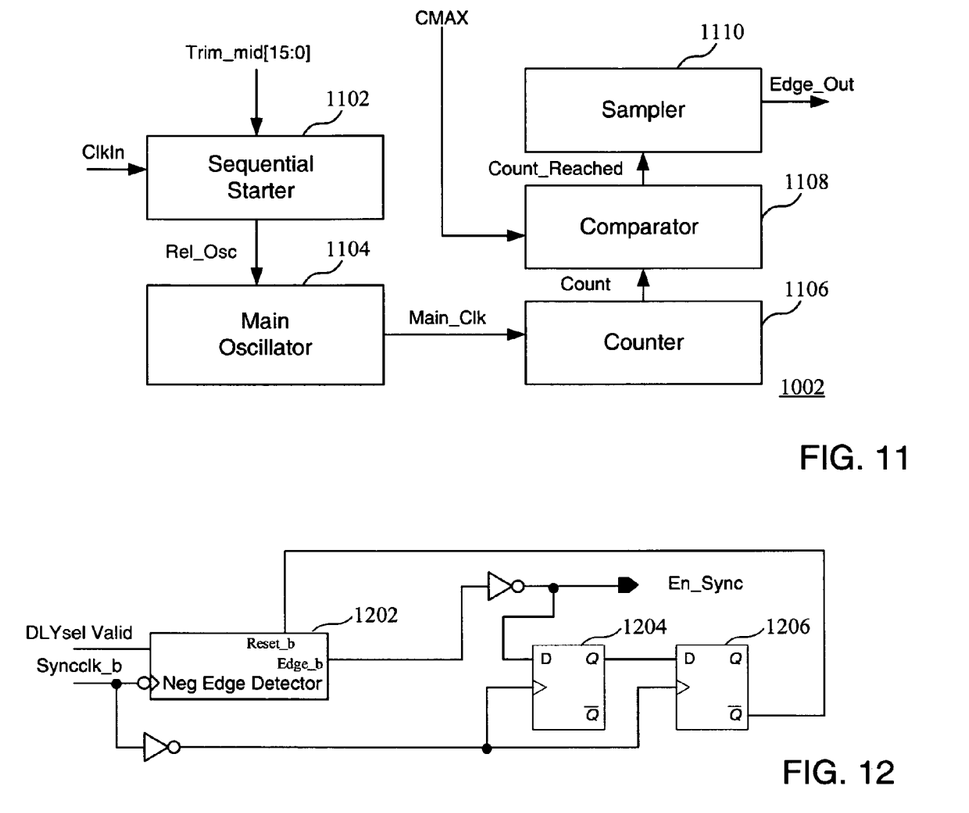
FIG. 11 is a block diagram of an edge delay unit 1002 of FIG. 10 according to an embodiment the present invention.
FIG. 12 is a block diagram of a circuit for generating an enable signal for synchronizing delay lines according to an embodiment the present invention.

Turning now to FIG. 11, a block diagram of an edge delay unit of FIG. 10 according to an embodiment the present invention is shown. Edge delay unit 1002 includes a sequential starter circuit 1102, a main oscillator 1104, a counter 1106, a comparator 1108, and a sampler 1110. Sequential starter circuit 1102 receives input clock Clkin and mid grain trim signal Trim_Mid, and provides a release oscillator control signal Rel_Osc to main oscillator 1104. Sequential starter circuit 1102 comprises an edge detector for detecting rising edges of Clkin and releases main oscillator 1104 to start oscillating when a rising edge is detected. Release oscillator control signal Rel_Osc may be a multi-bit signal that provides decoded mid trim information to main oscillator 1104. As will be explained below, this mid trim information is used to adjust the phase of main oscillator 1104 and to provide a mid grain delay adjustment.

In response to the Rel_Osc signal, main oscillator 1104 begins to oscillate at a predetermined frequency to produce a clock signal Main_Clk. Clock signal Main_Clk is then used to drive counter 1106. Counter 1106 may be an edge counter that increments at each rising and falling edge of clock signal Main_Clk. In other embodiments, counter 1106 may only count rising edges or falling edges. The output of counter 1106 is provided to comparator 1108 which compares the current count to the maximum count Cmax value. When count matches Cmax, the comparator provides a Count_Reached signal to sampler 1110 to indicate that the desired maximum count Cmax has been reached. Thus, counter 1106, in conjunction with main oscillator 1104 and comparator 1108, provides a coarse grain delay adjustment. For embodiments where counter 1106 is an edge counter, the size of each coarse grain delay step is equal to half the period of oscillation of clock signal Main_Clk from main oscillator 1104. That is, counter 1106 increments for every half-cycle of Main_Clk until Cmax is reached, thereby providing a total coarse delay that is equal to Cmax multiplied by one-half the period of oscillation of main oscillator 1104. Once counter 1106 has counted Cmax edges of Main_Clk, comparator 1108 asserts the Count_Reached signal, which is sampled by sampler 1110. When sampler 1110 detects that comparator 1108 has asserted Count_Reached, it provides a rising edge for the Edge_Out output signal for edge unit 1002.

Turning now to FIG. 12, a block diagram of a circuit for generating an enable signal for synchronizing delay lines according to an embodiment the present invention is shown. In particular, a negative edge detector 1202 is coupled to receive a delay select valid signal, and is clocked by an inverted synchronization signal, Syncclk_b. The output of the negative edge detector is coupled to an inverter to generate an enable sync signal. A pair of shift registers 1204 and 1206, which are also clocked by the Sycnclk_b signal, are used to generate a reset signal for the negative detector which is a delayed by two clock periods. As will be described in more detail in reference to FIG. 13, the delay allows the signals to settle so that the correct signals are captured. By generating an enable synchronization signal (En_Sync) to synchronize the clock enable of delay select FFs, the control block can run on a single clock domain with a different frequency and phase.

Figure 13:
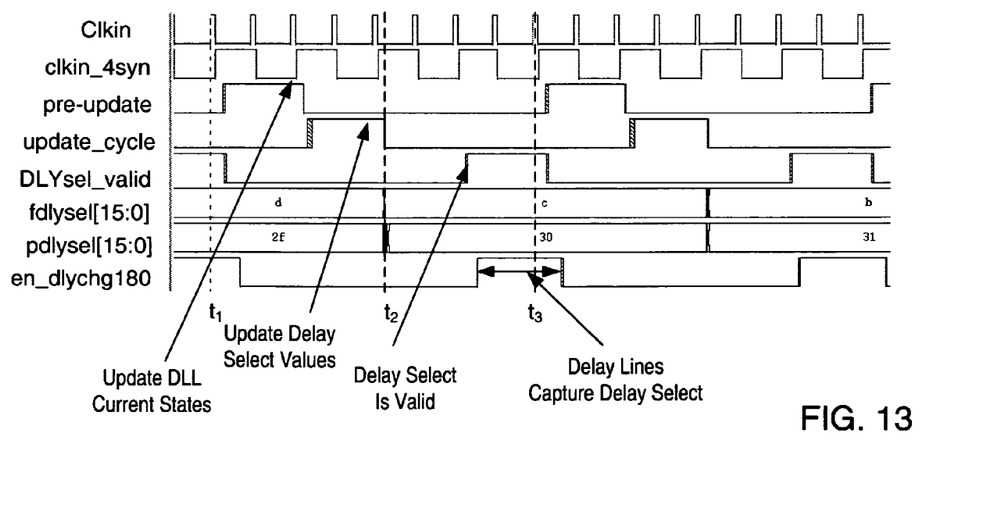
FIG. 13 is a timing diagram showing the capturing of delay select vectors for delay lines according to an embodiment the present invention.

Turning now to FIG. 13, a timing diagram shows the capturing of delay select vectors for delay lines and enabling the changing of delay select vectors according to an embodiment the present invention. That is, the delay select value updates occur in intervals such that there are no setup and hold time issues for delay line circuits. Moreover, the update_cycle timing insures that delay select changes have up to 8 clock cycles (shown between time $t_1$ and $t_3$) to settle, leading to significant area reduction compared to circuits not taking advantage of multi-cycle path constraints. An input clock signal (Clkin) is used to generate a clock signal clkin_4syn which has a fifty percent duty cycle at half the clock rate of the input clock signal. During a pre-update cycle, the circuit is updated with current states. During an update cycle, the delay select values themselves are then updated. As can be seen after the update cycle at time $t_2$, the fdlysel[15:0] and the polysel[15:0] hex values are updated from values of "d" and "2f" to values of "c" and "30" respectively. After a delay select valid signal is received (as shown for example by the negative edge detector in the circuit of FIG. 12), an enable delay change signal (which comprises an enable synchronization signal designated as en_dlychg180 for circuits providing frequency alignment) signal is generated to capture the delay select values for the delay lines. Accordingly, the fdlysel[15:0] and the polysel[15:0] values are captured (show as values of "c" and "30" respectively).

Figure 14:
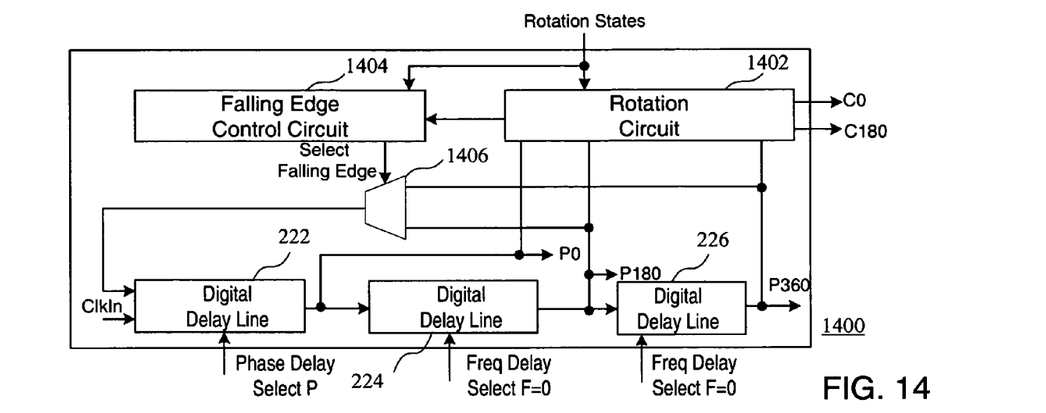
FIG. 14 is a block diagram of a circuit enabling rotation and controlling the falling edge of a clock signal during rotation according to an embodiment the present invention.

Turning now to FIG. 14, a block diagram shows a circuit for enabling rotation and controlling of the falling edge of a clock signal during rotation according to an embodiment of the present invention. In particular, a circuit 1400 comprises the delay lines of deskewing circuit 220. An input clock signal Clkin is coupled to the deskewing circuit 220 comprising the phase shifting digital delay line 222 which is coupled to receive a phase shifting delay select vector (pdlysel). The output of the phase shifting digital delay line 222 is a phase aligned output P0 which is coupled to a pair or frequency shifting digital delay lines comprising a first digital delay line 224 and a second digital delay line 226, each of which receives a frequency delay select vector (fdlysel). The output of the first digital delay line comprises a P180 signal which is a 180 degree phase shifted signal of P0, and is coupled to the input of the second digital delay line 226. The output of the second digital delay line is a 360 degree shifted signal P360.

However, a rotation circuit 1402 receives rotations states (which are described in detail in reference to FIGS. 15 and 16) to determine whether the output signal C0 should be provided as an output P0, or should be P180 signal with the additional 180 degree phase shift. That is, the rotation circuit ensures that the amount of shifting does not exceed the period T minus the recovery time that the delay line requires to receive the next edge. As can be seen in the following equation:

$$T=2I+2F \qquad (8)$$

The amount of shifting can be established by the following equation:

$$\text{Shifting}=I+P+R \qquad (9)$$

where R equals a recovery delay. Accordingly, $$I+P+R<2+2F, \text{ where} \qquad (10)$$

$$P<2F+I-R, \text{ and} \qquad (11)$$

$$P<2F. \qquad (12)$$

Accordingly, the maximum desired shifting for deskewing is:

$$T-I=2F+I. \qquad (13)$$

Figure 16:
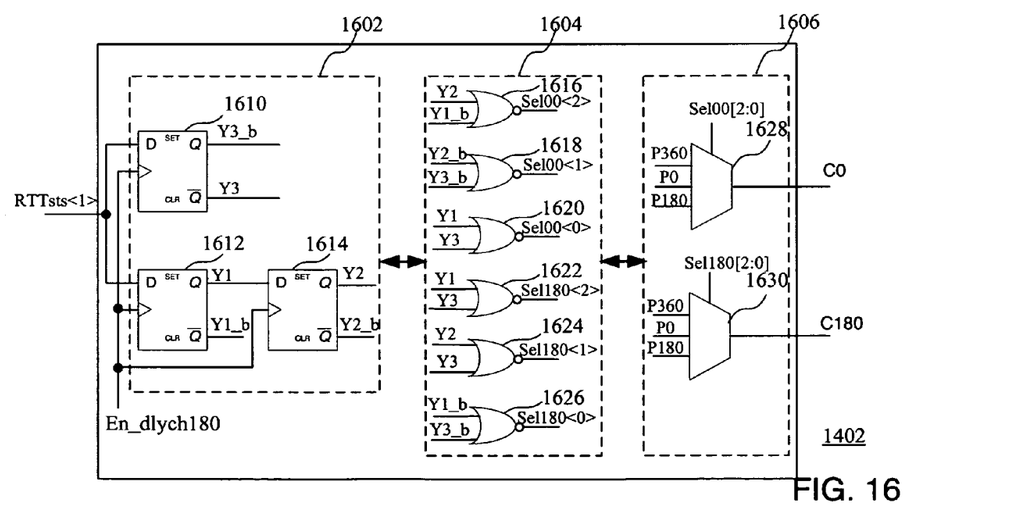
FIG. 16 is a block diagram of a circuit for enabling rotation according to an embodiment the present invention.
Figure 17:
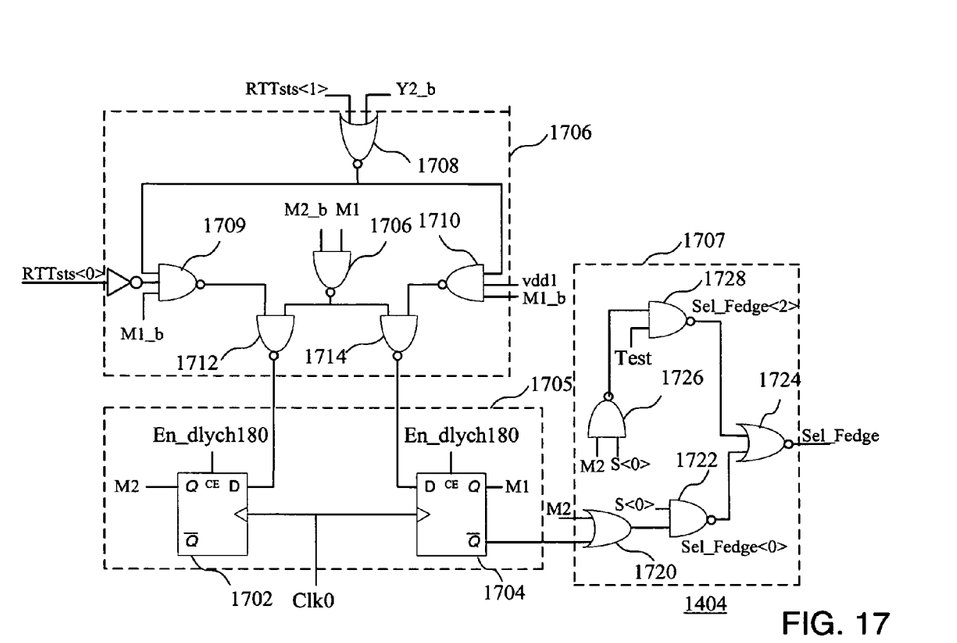
FIG. 17 is a block diagram of a circuit for enabling falling edge control according to an embodiment the present invention.

Therefore, in order to avoid exceeding the maximum amount of shifting when deskewing, a different phase of the input clock signal can be selected as will be described in detail to reference to FIGS. 15-18. Further, a multiplexer 1406, which is coupled to receive a select falling edge signal from the falling edge control circuit 1404, will coupled either the P180 or P360 signals to the input of digital delay line 222 during rotation, as will be described in more detail in reference to FIG. 18. That is, while P180 is generally coupled to the input of digital delay line 222 during rotation, P360 may be coupled to the input under certain circumstances. As will also be described in more detail below, FIG. 15 shows a transition diagram for determining whether to couple P0 and P180 to generate C0, while FIG. 16 shows an example of the Rotation Circuit 1402 and FIG. 17 shows an example of the Falling Edge Control Circuit 1404.

Figure 15:
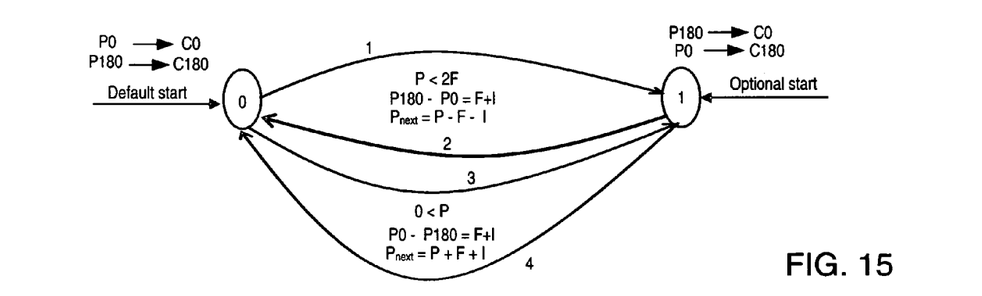
FIG. 15 is a transition diagram showing rotation according to an embodiment of the present invention.

Turning now to FIG. 15, a transition diagram shows rotation according to an embodiment the present invention. For deskewing, the phase alignment delay line must shift a whole period. Because this is not possible with a single delay line, one of the freq alignment delay lines is used. According to one aspect of the invention, glitch-free borrowing of freq alignment delay line before and after lock is referred to as rotational deskewing. Generally, if the value of P calculated to provide phase alignment approaches 2F, the circuit is designed to rotate back. That is, the circuit is rotated back, where:

$$P180-P0=F+I, \text{ and therefore,} \qquad (14)$$

$$P_{next}=P-F-I \qquad (15)$$

Because the value of $P_{next}$ depends upon current value of P, when in a first state 0 where P0 is coupled to the output C0 (and P180 is coupled to the output C180), P180 is now coupled to C0 (and P0 is coupled to C180) after rotation. In contrast, when in a second state 1 where P180 is coupled to the output C0 (and P0 is coupled to the output C180) after rotation, P0 is now coupled to C0 (and P180 is coupled to C180). Similarly, if the value of P calculated to provide phase alignment approaches 0, the circuit is designed to rotate forward to avoid P being less than zero. That is, when P approaches zero, $$P0-P180=F+I, \text{ and therefore,} \qquad (16)$$

$$P_{next}=P+F+I \qquad (17)$$

Accordingly, when in a first state 0, P180 is now coupled to C0 after rotation. In contrast, when in a second state 1, P0 is now coupled to C0 after rotation.

FIGS. 16 and 17 provide circuits for enabling glitch-free rotation. Turning first to FIG. 16, a block diagram of a circuit for enabling rotation according to an embodiment the present invention is shown. In particular, the rotation circuit 1402 comprises a signal generation circuit 1602, an output select circuit 1604 and an output circuit 1606. The signal generation circuit comprises a plurality of registers 1610-1614 for generating Y1, Y2 and Y3 signals, and their respective complements. Each of the registers is clocked by an enable delay change 180 (En_dlych180) signal, and receives as an input the rotation state information (RTTsts<1>) representing the current state. Accordingly, the circuit will generate a particular output of Y1-Y3 values depending upon the RTTsts<1>. The Y1, Y2 and Y3 signals are coupled to the output select circuit 1604 comprising a plurality of NOR gates 1616 through 1626. In particular, NOR gate 1616 receives Y2 and Y1_b, and outputs a Sel00<2> signal. Similarly, NOR gate 1618 receives Y2_b and Y3_b, and outputs a Sel00<1> signal. NOR gate 1620 receives Y1 and Y3, and outputs a Sel00<0> signal. NOR gate 1622 receives Y1 and Y3, and outputs a Sel180<2> signal. NOR gate 1624 receives Y2 and Y3, and outputs a Sel180<1> signal. Finally, NOR gate 1626 receives Y1_b and Y3_b, and outputs a Sel180<0> signal. The Sel00<2:0> signal is used to select one of P0, P180 and P360 which is provided as the C0 signal, while the Sel180<2:0> signal is used to select one of P0, P180 and P360 which is provided as the C180 signal. Accordingly, the circuit of FIG. 16 implements the transition diagram of FIG. 15.

Turning now to FIG. 17, a falling edge control circuit 1404 according to an embodiment the present invention is shown. During rotation, it may be necessary to use the P360 signal for rotation, as will be described in the timing diagram of FIG. 18. As shown in FIG. 17, the rotation states RTTsts<0> (representing the direction of rotation) and RTTsts<1> (representing the current state), as well as the Y1, Y2 and Y3 signals generated according to the circuit of FIG. 16, and their respective complements, are input to the falling edge control circuit, while a select falling edge (Sel_Fedge) signal is generated as an output. Signals M1 and M2 and their complements are generated internally and used to generate the select falling edge signal. In particular, a pair of registers 1702 and 1704 of an M signal generation circuit is used to generate M1 and M2 signals and their complements. The pair of registers receive inputs from a logic circuit 1706 which generates output signals based upon the rotation states as well as M1 and M2 signals feedback to the circuit. Finally, an output signal generator 1707 outputs the select falling edge signal based upon the M signals generated within the circuit.

The logic circuit 1706 comprises a NOR gate 1708 receiving the RTTsts<1> signal and Y2_b signal at its inputs, and has an output coupled to a pair of NAND gates 1709 and 1710. The first NAND gate 1709 also receives an inverted RTTsts<0> signal and M1_b signal at its input, while the second NAND gate 1710 receives a vdd1 signal and M1_b signal. The outputs of the NAND gates 1709 and 1710 are coupled to another pair of NAND gates 1712 and 1714 respectively, each of which also receives an output of a NAND gate 1716 which is coupled to receive M2_b and M1 as inputs. The outputs of the NAND gates 1712 and 1714 are coupled to the inputs of registers 1702 and 1704.

Finally, the outputs of the registers 1702 and 1704 are coupled to output signal generator 1707. In particular, a NOR gate 1720 is coupled to receive M1 and M2_b, and to generate an output to an input of an NAND gate 1722, which receives S<0> at its other input. Another NAND gate 1726 is coupled to receive M2 and S<0> as inputs, and to generate an output to a NAND gate 1728. The output of NAND gate 1722 (Sel_Fedge<0>) and NAND gate 1728 (Sel_Fedge<2>) are coupled to a NOR gate 1724 which outputs the select falling edge signal. As will be described below with respect to FIG. 18, the select falling edge signal is used to select either P180 or P360 to generate the falling edge of the phase adjustment delay line 222 depending upon the rotation states.

Figure 18:
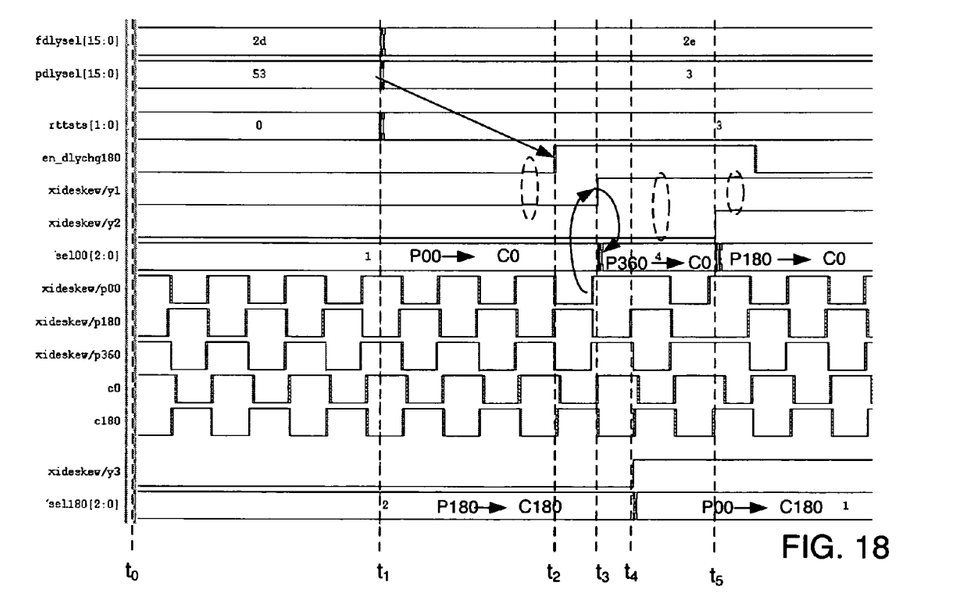
FIG. 18 is a timing diagram showing an example of rotation according to an embodiment the present invention.

As can be seen in the timing diagram of FIG. 18, the Sel00 signal is used to select which phase aligned signal is coupled to generate the output clock signal C0. Initial hex values of fdlysel[15:0] and polysel[15:0] stored in the circuit are used, for example 2d and 53 respectively in this example. The circuit is in a certain state indicated by rttsts[1:0]. Also, the sel00[2:0] is in an initial state at a time $t_1$, where P0 is initially coupled to C0. As can be seen, the rttsts[1:0] changes from a state 1 to a state 3. After an enable delay change (En_dlychg180) signal goes high at a time $t_2$, rotation starts at a time $t_3$ when Y1 goes high, where P360 is coupled to C0. That is, because it is determined that there must be a rotation forward and P360 is 360-degree shifted copy of P0. As can be seen in the xideskew/p00 signal, the signal remains high for an extended clock period after $t_3$, thereby providing glitchless rotation. At a time $t_4$, when Y3 goes high, the sel180[2:0] changes from 2 to 1, enabling rotation of the C180 signal, where P0 is used to create C180. Finally, at a time $t_5$, the signal P180 is coupled to C0 to complete rotation process. The long high time of P360 at $t_5$ ensures that the switch from P360 to P180 is glitchless. Accordingly, the circuits of FIGS. 16-17 enable glitchless rotation of an output clock signal.

It can therefore be appreciated that the new and novel method of and circuit for deskewing and shifting clock signals has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of deskewing a clock signal in a circuit having at least one delay line, said method comprising the steps of:
    measuring an intrinsic delay in said delay line;
    aligning the frequency of a generated clock signal with the frequency of a reference clock signal; and
    aligning the phase of said generated clock signal and said reference clock signal using said measured intrinsic delay;
    wherein said step of measuring an intrinsic delay in said delay line comprises a step of comparing an output of a first delay line to an output of a third delay line, wherein said first delay line, a second delay line and said third delay line are coupled in series.

2. The method of claim 1 further comprising a step of setting delay vectors for said second and third delay lines to zero.

3. The method of claim 2 wherein said step of measuring an intrinsic delay further comprises a step of adjusting a delay vector of said first delay line until the output of said first delay line is in phase with the output of said third delay line.

4. The method of claim 3 further comprising a step of generating a clock enable signal coupled to synchronize said first, second and third delay lines.

5. The method of claim 1 wherein said step of aligning the frequency of said generated clock signal with said reference clock signal comprises a step of initially attempting to align the frequency in a high frequency mode.

6. The method of claim 5 further comprising a step of automatically attempting to align the frequency in a low frequency mode if a frequency delay vectors exceeds a predetermined value.

7. A circuit for deskewing a clock signal in a circuit having a delay line, said circuit comprising:
- a phase synchronization circuit having a first delay line coupled to receive a reference clock signal and a phase delay vector;
- a frequency synchronization circuit coupled to said phase synchronization circuit, said frequency synchronization circuit comprising a second delay line and a third delay line coupled in series and receiving a frequency delay vector; and
- a control circuit coupled to select one of the outputs of said first delay line, said second delay line and said third delay line to generate an output clock signal;
- wherein said control circuit controls said phase delay vector such that the output of the phase synchronization circuit is in phase with the output of said frequency synchronization circuit when said frequency delay vector is set equal to zero.

8. The circuit of claim 7 further comprising a delay select valid circuit generating an enable signal coupled to said first, second and third delay lines.

9. The circuit of claim 7 further comprising a fourth delay line and a fifth delay line coupled in series and receiving a clock output signal, said fourth delay line generating a first phase shifted output and said fifth delay line generating a second phase shifted output.

10. The circuit of claim 9 further comprising a sixth delay line and a seventh delay line coupled in series at the input of said first delay line, said sixth and seventh delay lines providing shifting of said reference clock signal at the input of said circuit.

11. The circuit of claim 10 wherein said control circuit and said delay lines are implemented in programmable logic.

12. The circuit of claim 11 wherein said first, second and third delay lines comprises counter-controlled delay lines implemented in programmable logic.

13. A circuit for deskewing a clock signal, said circuit comprising:
- means for synchronizing a phase of a reference clock signal and a generated clock signal using a phase delay vector for a delay line;
- means for synchronizing a frequency of said reference clock signal and said generated clock signal;
- means for selecting said phase delay vector based upon an intrinsic delay of said delay line; and
- means for providing rotation of said generated clock signal based upon a determined phase delay vector.

14. The circuit of claim 13 further comprising means for selecting a phase of said reference clock signal input to said circuit.

15. The circuit of claim 13 further comprising means for providing a counter-controlled delay line for said delay line.

16. The circuit of claim 13 further comprising means for synchronizing a plurality of delay lines of said means for synchronizing the phase and said means for synchronizing the frequency.

17. The circuit of claim 16 further comprising means for enabling a first delay line to use a clock edge of a second delay line.

* * * * *